(12) United States Patent
Lee et al.

(10) Patent No.: US 10,640,865 B2
(45) Date of Patent: May 5, 2020

(54) SUBSTRATE PROCESSING APPARATUS AND METHOD FOR MANUFACTURING SEMICONDUCTOR DEVICE USING THE SAME

(71) Applicants: Joon-Myoung Lee, Anyang-si (KR); Yong-Sung Park, Suwon-si (KR); Whan-Kyun Kim, Seoul (KR); Se-Chung Oh, Yongin-si (KR); Young-Man Jang, Hwaseong-si (KR)

(72) Inventors: Joon-Myoung Lee, Anyang-si (KR); Yong-Sung Park, Suwon-si (KR); Whan-Kyun Kim, Seoul (KR); Se-Chung Oh, Yongin-si (KR); Young-Man Jang, Hwaseong-si (KR)

(73) Assignee: Samsung Electronics Co., Ltd., Suwon-Si, Gyeonggi-do (KR)

(\*) Notice: Subject to any disclaimer, the term of this patent is extended or adjusted under 35 U.S.C. 154(b) by 236 days.

(21) Appl. No.: 15/629,793

(22) Filed: Jun. 22, 2017

(65) Prior Publication Data
US 2018/0073131 A1    Mar. 15, 2018

(30) Foreign Application Priority Data

Sep. 9, 2016  (KR) .................. 10-2016-0116795
Nov. 15, 2016  (KR) .................. 10-2016-0151867

(51) Int. Cl.
*C23C 14/34* (2006.01)
*H01J 37/32* (2006.01)
*C23C 16/455* (2006.01)

(52) U.S. Cl.
CPC ........ *C23C 14/34* (2013.01); *C23C 16/45563* (2013.01); *H01J 37/3244* (2013.01); *H01J 37/32715* (2013.01)

(58) Field of Classification Search
CPC ...................................................... C23C 14/34
See application file for complete search history.

(56) References Cited

U.S. PATENT DOCUMENTS

| | | | |
|---|---|---|---|
| 4,297,189 A * | 10/1981 | Smith, Jr. | ............... C23C 14/34 204/192.12 |
| 5,350,479 A | 9/1994 | Collins et al. | |
| 5,806,319 A | 9/1998 | Wary et al. | |
| 8,337,676 B2 | 12/2012 | Zhao et al. | |
| 2002/0015259 A1* | 2/2002 | Nishihara | ............... C23C 14/34 360/125.01 |

(Continued)

FOREIGN PATENT DOCUMENTS

| KR | 10-0521709 B1 | 10/2005 |
|---|---|---|
| KR | 10-2016-0042059 A | 4/2016 |
| KR | 10-2017-0045696 A | 4/2017 |

*Primary Examiner* — Joseph A Miller, Jr.
(74) *Attorney, Agent, or Firm* — Lee IP Law, PC

(57) ABSTRACT

A substrate processing apparatus including a chamber accommodating a substrate; a substrate support in the chamber, the substrate support supporting the substrate; a gas injector to inject an oxidizing gas for oxidizing a metal layer to be disposed on the substrate; a cooler under the substrate to cool the substrate; a target mount disposed on the substrate, the target mount including a target for performing a sputtering process; and a blocker between the target and the gas injector, the blocker shielding the target from the oxidizing gas injected from the gas injector.

9 Claims, 11 Drawing Sheets

(56) References Cited

U.S. PATENT DOCUMENTS

| | | |
|---|---|---|
| 2003/0030944 A1 | 2/2003 | Lin et al. |
| 2003/0224619 A1 | 12/2003 | Ono et al. |
| 2006/0042930 A1* | 3/2006 | Mauri .................... B82Y 25/00 |
| | | 204/192.15 |
| 2015/0047975 A1 | 2/2015 | West et al. |
| 2015/0107273 A1 | 4/2015 | Anantharaman |
| 2015/0294845 A1* | 10/2015 | Shimane ................. C23C 14/34 |
| | | 204/298.11 |
| 2016/0071707 A1 | 3/2016 | Furukawa et al. |
| 2017/0110301 A1 | 4/2017 | Lee et al. |

* cited by examiner

SUBSTRATE PROCESSING APPARATUS AND METHOD FOR MANUFACTURING SEMICONDUCTOR DEVICE USING THE SAME

CROSS-REFERENCE TO RELATED APPLICATION

Korean Patent Application Nos. 10-2016-0116795 and 10-2016-0151867, filed on Sep. 9, 2016 and Nov. 15, 2016, respectively, in the Korean Intellectual Property Office (KIPO), and entitled: "Substrate Processing apparatus and Method for Manufacturing Semiconductor Device Using the Same," is incorporated by reference herein in its entirety.

BACKGROUND

1. Field

Embodiments relate to a substrate processing apparatus and a method for manufacturing a semiconductor device using the same.

2. Description of Related Art

A sputtering apparatus may be used to deposit a thin film to form a magnetic tunnel junction (MTJ) structure for an MRAM device. In the MRAM device, a switching current may be applied to the MTJ structure to switch a magnetization of a free layer (FL) included in the MTJ structure.

SUMMARY

The embodiments may be realized by providing a substrate processing apparatus including a chamber accommodating a substrate; a substrate support in the chamber, the substrate support supporting the substrate; a gas injector to inject an oxidizing gas for oxidizing a metal layer to be disposed on the substrate; a cooler under the substrate to cool the substrate; a target mount disposed on the substrate, the target mount including a target for performing a sputtering process; and a blocker between the target and the gas injector, the blocker shielding the target from the oxidizing gas injected from the gas injector.

The embodiments may be realized by providing a substrate processing apparatus a chamber accommodating a substrate; a substrate support in the chamber, the substrate support supporting the substrate; a cooler under the substrate to cool the substrate; a gate disposed to be movable on the substrate support in the chamber and operated to selectively divide the chamber into upper and lower chambers; a gas injector to inject an oxidizing gas for oxidizing a metal layer on the substrate; and a target mount facing the substrate and including a target for performing a sputtering process.

The embodiments may be realized by providing a substrate processing apparatus including a chamber in which a substrate is accommodatable; a substrate support in the chamber and on which the substrate is supportable, the substrate support including a cooler therein; a target mount facing the substrate support, the target mount including a target for performing a sputtering process that forms a metal layer on the substrate, a gas injector to inject an oxidizing gas that oxidizes the metal layer on the substrate; a blocker between the target and the gas injector, the blocker shielding the target from the oxidizing gas.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
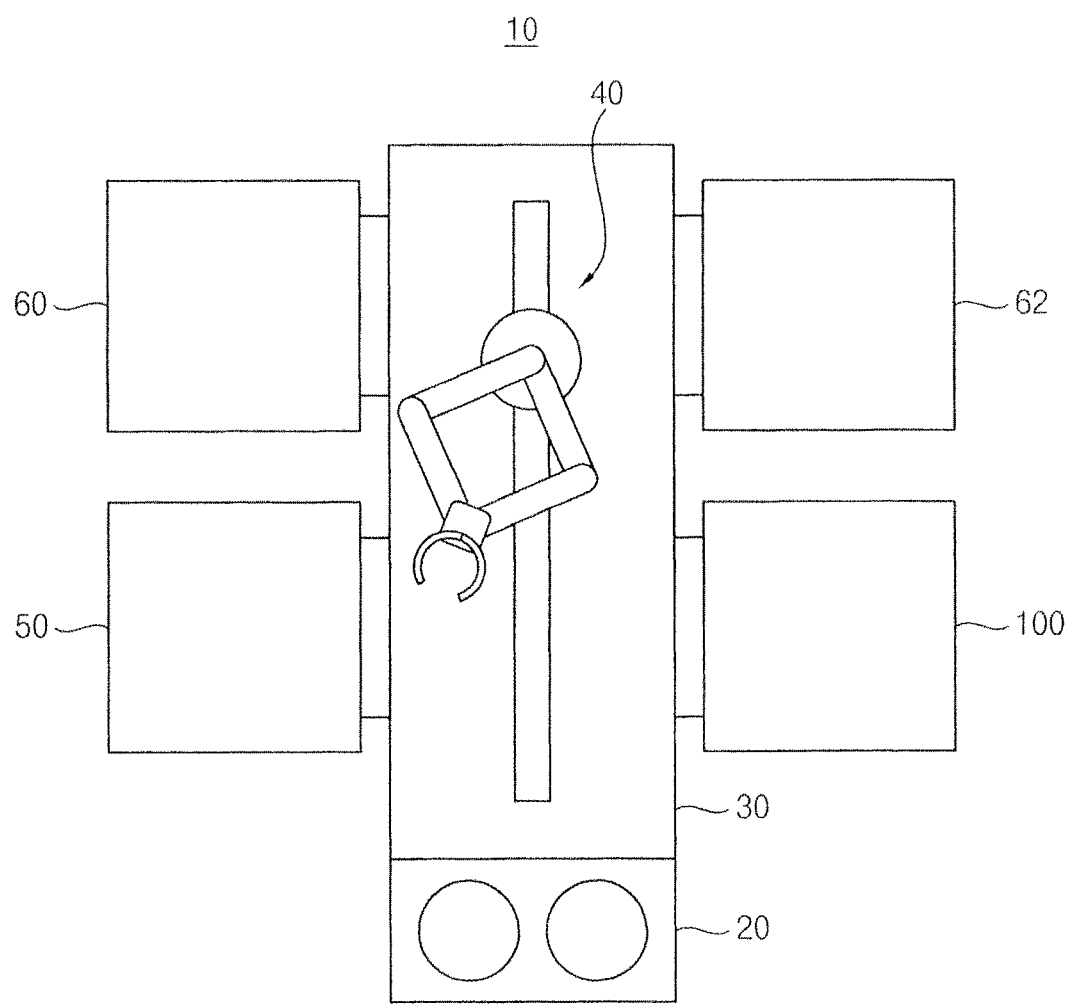
FIG. 1 illustrates a plan view of a substrate processing system in accordance with example embodiments.
Figure 2:
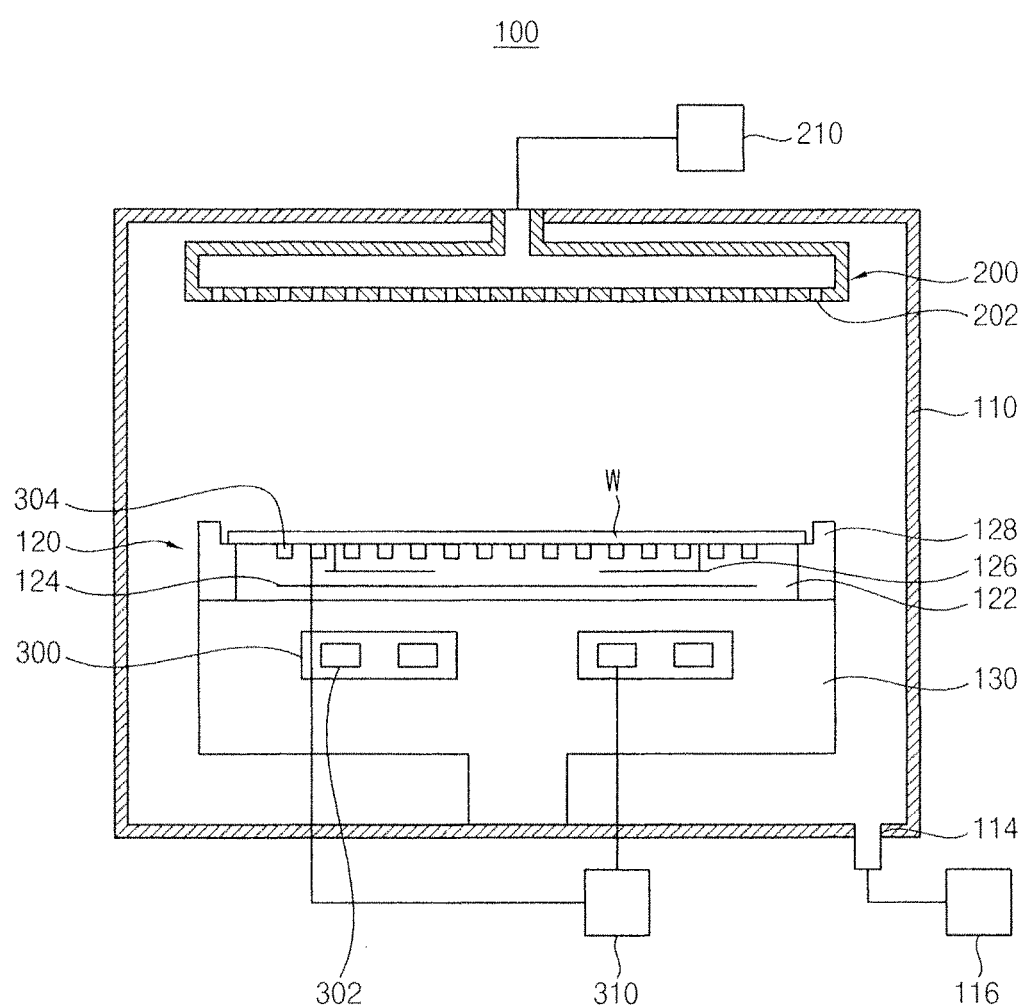
FIG. 2 illustrates a cross-sectional view of a substrate processing apparatus of a substrate processing system according to an exemplary embodiment.
Figure 3:
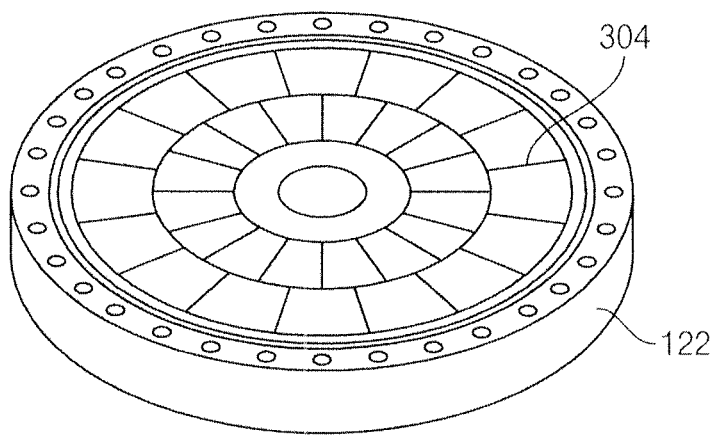
FIG. 3 illustrates a perspective view of an electrostatic chuck of a substrate processing apparatus according to an exemplary embodiment.

FIG. 1 illustrates a plan view of a substrate processing system in accordance with example embodiments. FIG. 2 illustrates a cross-sectional view of a substrate processing apparatus of the substrate processing system of FIG. 1. FIG. 3 illustrates a perspective view of an electrostatic chuck of the substrate processing apparatus of FIG. 2.

Referring to FIGS. 1 to 3, the substrate processing system 10 may include a load lock chamber 20 for loading and unloading a substrate, e.g. a wafer, a transfer chamber 30 having a transfer robot 40 for transferring the substrate, and a plurality of process chambers 50, 60, 62 and 100. The transfer chamber 30 may be at a side of the load lock chamber 20. The plurality of process chambers 50, 60, 62 and 100 may be at sides of the transfer chamber 30.

In an implementation, the substrate processing system 10 may be used to manufacture an MRAM device on the wafer. For example, the substrate processing system 10 may be used to form a metal oxide layer on a free layer FL of a magnetic tunnel junction (MTJ) structure.

The load lock chamber 20 may receive a wafer from a wafer carrier supported by an index module, and the wafer in the load lock chamber 20 may be transferred into one of the process chambers 50, 60, 62 and 100 by the transfer robot 40, respectively. The transfer robot 40 may also transfer the wafer in the process chamber into the load lock chamber 20, and the wafer in the load lock chamber 20 may be transferred back to the wafer carrier on the index module.

The plurality of process chambers may include, e.g., a deposition chamber 50, a cooling oxidation chamber 100, a first additional chamber 60, and a second additional chamber 62.

The deposition chamber 50 may be a sputtering chamber and may be used for forming a metal layer on the wafer. For example, the deposition chamber 50 may be a radio frequency (RF) sputtering chamber that is capable of performing a physical vapor deposition (PVD) process using a RF power source. A target and a substrate stage may be provided in the deposition chamber 50. After mounting the wafer on the substrate stage, materials ejected from the target may be deposited on the wafer by a sputtering process. The deposition material may include heavy metals, e.g., tungsten, platinum, or bismuth. The wafer, on which the metal layer is formed, may be transferred into the cooling oxidation chamber 100.

The cooling oxidation chamber 100 may be a substrate processing apparatus that is used for oxidizing the metal layer on the wafer at a low temperature. Hereinafter, for convenience of explanation, the cooling oxidation chamber will be referred to as a substrate processing apparatus.

Referring to FIG. 2, the substrate processing apparatus 100 may include a chamber 110, a substrate support 120, a cooler, and a gas injector. The substrate support 120 may be in the chamber 110 and may support a substrate, such as a wafer W (e.g., the substrate support 120 may be such that a wafer W is supportable thereon). The cooler may be in the substrate support 120 and used for cooling the substrate. The gas injector may be used for injecting an oxidizing gas that oxidizes the metal layer on the substrate.

In an implementation, the substrate processing apparatus 100 may be used for oxidizing the metal layer formed on the substrate, such as a wafer W, to form a metal oxide layer. The metal oxide layer may be formed on a free layer pattern of a magnetic tunnel junction (MTJ) structure to help reduce a switching current density. The metal oxide layer may include an oxide of a metal having a large spin-orbit coupling. For example, the metal oxide layer may include an oxide of a heavy metal, such as tungsten, tantalum, platinum, or bismuth.

The chamber 110 may provide a space, in which processes for treating the substrate are performed. The chamber 110 may be formed of, e.g., a metal. The chamber 110 may be grounded. An exhaust port 114 may be provided in a lower portion of the chamber 110, and an exhauster 116 may be connected to the exhaust port 114 through an exhaust pipe. The exhauster 116 may include a vacuum pump, by which an internal pressure of the chamber 110 is adjusted. In an implementation, gases in the chamber and reaction by-products generated during a process may be discharged to an outside through the exhaust pipe.

The substrate support 120 may include an electrostatic chuck 122 as an upper plate for attracting or coupling with the wafer W using an electrostatic force. The electrostatic chuck 122 may include an electrostatic electrode 124 that receives power from an external power supply and applies an electrostatic force to the wafer W. For example, the electrostatic electrode 124 may be electrically connected to a DC power supply. In an implementation, the substrate support 120 may support the wafer W using a mechanical clamping mechanism.

The substrate support 120 may include an electrode plate 130 as a lower plate under (e.g., supporting) the electrostatic chuck 122. The electrode plate 130 may have a disk shape corresponding to a shape of the electrostatic chuck 122. The electrode plate 130 may include a conductive material. The electrode plate 130 may be grounded or connected to a high frequency power source.

The substrate support 120 may include a lift pin 126 that is used for lifting the wafer W on the electrostatic chuck 122.

In an implementation, the substrate support 120 may include a driver to move the electrostatic chuck, e.g., upwardly, downwardly, and rotatably.

In an implementation, the substrate support 120 may include a ring-shaped focus ring 128 that is disposed on or an (e.g., outer) edge region thereof. The focus ring 128 may surround an edge region of the wafer W.

The cooler may be disposed below the wafer W and may cool the wafer W. The cooler may operate to keep the wafer W at an extremely low temperature or relatively low temperature. In an implementation, the cooler may operate to keep the wafer W at a temperature of, e.g., less than about 298 K. In an implementation, the cooler may employ a refrigerator 310 that is used in a cryopump.

In an implementation, the cooler may include a cooling plate in the electrode plate 130. The cooling plate 300 may include a cooling channel 302, through which cooling fluid flows. The refrigerator 310 may be connected to the cooling channel 302 to supply the cooling fluid to the cooling channel 302. In an implementation, the cooling plate may include a cooling surface in direct contact with a lower surface of the electrostatic chuck 122. For example, the cooling plate may absorb heat from the electrostatic chuck 122.

The cooler may include a cooling gas passage 304 in an upper surface of the electrostatic chuck 122 (e.g., adjacent to where the wafer W is to be accommodated). The refrigerator 310 may be connected to the cooling passage 304 to supply a cooling gas to the cooling passage 304. The cooling gas may be in contact with a surface of the wafer W, and thus, a temperature of the wafer W may be kept at the extremely low temperature or relatively low temperature. In an implementation, the cooling gas may include, e.g., argon (Ar) or helium (He).

The gas injector may be configured to inject an oxidizing gas for oxidizing a metal layer on the substrate. The gas injector may include a showerhead 200 having a plurality of injection holes 202 for injecting the oxidizing gas onto or toward the substrate. The showerhead 200 may be installed over (e.g., parallel with and facing) the substrate support 120, and may inject the oxidizing gas through the injection holes 202. A gas supply 210 may be connected to the showerhead 200 to supply the oxidizing gas. In an implementation, the oxidizing gas may include, e.g., pure oxygen or a compound gas including oxygen.

In an implementation, a magnetic tunnel junction (MTJ) structure may be formed on the wafer W. The magnetic tunnel junction (MTJ) structure may include a fixed layer structure, a tunnel barrier layer, and a free layer that are sequentially stacked on the wafer W. In an implementation, a metal layer may be formed on the free layer. The substrate processing apparatus 100 may be used for oxidizing the metal layer to form a metal oxide layer. A switching distribution of the free layer may be improved by the metal oxide layer.

In an implementation, when the wafer W is kept at the extremely low temperature by the cooler, the oxidizing gas may be injected onto the metal layer via the injection holes 202 of the showerhead 200 to form the metal oxide layer on the wafer W. Oxygen may have a tendency to bond with the free layer. It may be desirable to help prevent the oxygen from moving to the free layer when the free layer includes cobalt-iron-boron (CoFeB).

The cooler may be used to cool the electrostatic chuck 122 down to a low temperature, e.g., about 298K or less, by absorbing heat by a liquid refrigerant. The wafer W may be moved onto the electrostatic chuck 122 that is kept at the low temperature, and then fixed on the electrostatic chuck 122. For efficient heat transfer, the cooling gas, e.g. argon (Ar) or helium (He), may be injected into the cooling gas passage 304 of the electrostatic chuck 122 to drop a temperature of the wafer W to a target temperature. When the temperature of the wafer W reaches the target temperature, oxygen gas may be uniformly injected toward the metal layer via the injection holes 202 of the showerhead 200 to form the metal oxide layer on the wafer W.

The metal oxide layer may be formed at the low temperature, and oxygen may be prevented from penetrating into the free layer when forming the metal oxide layer. For example, defects due to oxygen migration into the free layer may be reduced.

In an implementation, the substrate processing apparatus may perform processes, which are performed in other cooling and oxidation chambers, in one chamber, thereby reducing footprint of chambers compared to other substrate processing systems.

Figure 4:
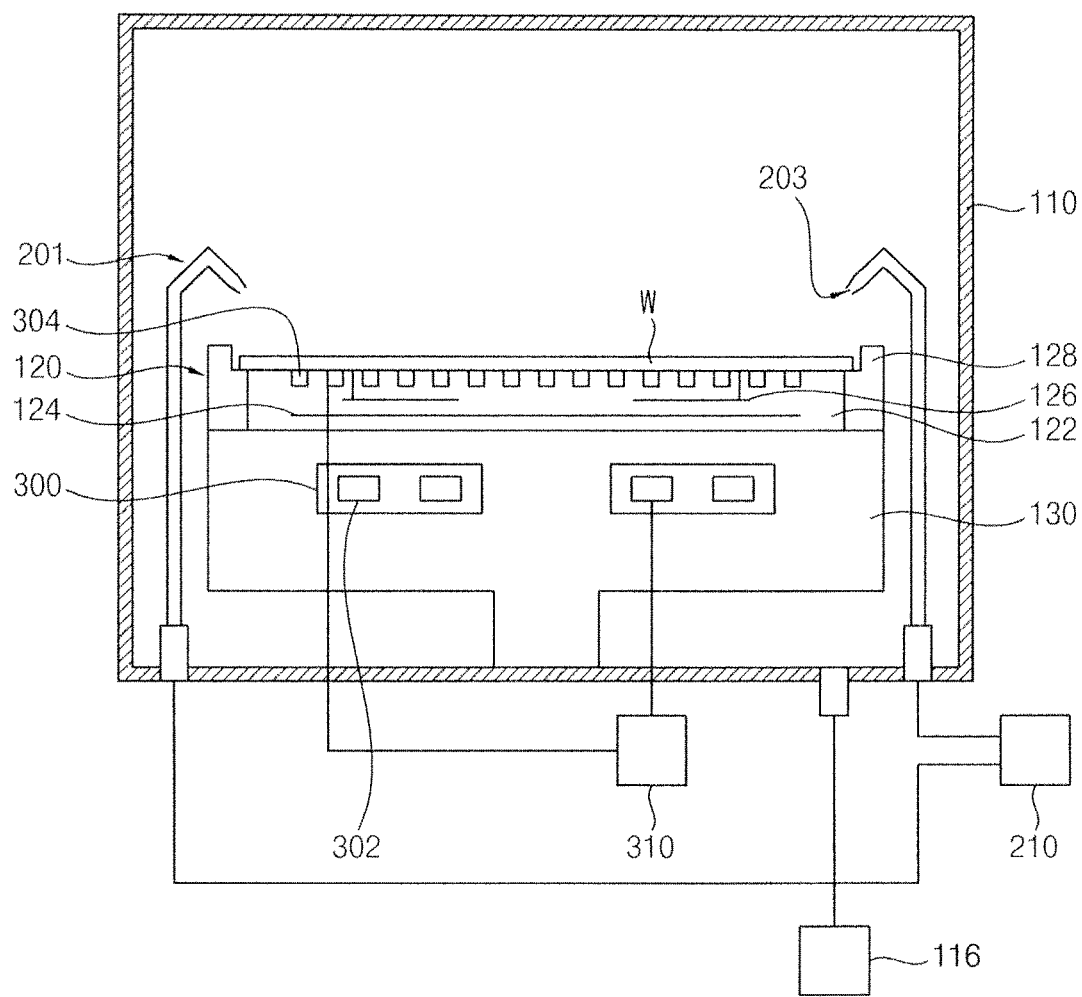
FIG. 4 illustrates a cross-sectional view of a substrate processing apparatus in accordance with example embodiments.

FIG. 4 illustrates a cross-sectional view of a substrate processing apparatus according to some embodiments. The substrate processing apparatus may be substantially the same as or similar to the substrate processing apparatus described with reference to FIGS. 1 to 3 except for a gas injector.

Referring to FIG. 4, a gas injector of a substrate processing apparatus 101 may include at least one gas nozzle 201 for injecting an oxidizing gas into a chamber 110.

In an implementation, the gas injector may include a plurality of gas nozzles 201 disposed around a substrate support 120. The gas nozzle 201 may include a gas introduction portion extending upwardly from a lower surface of the chamber 110, a nozzle portion having an injection hole 203 from the gas introduction portion toward a wafer on the substrate support 120.

The nozzle portion of the gas nozzle 201 may be provided over or facing the substrate support 120, and may spray the oxidizing gas (for oxidizing a metal layer on the wafer W). A gas supply 210 may be connected to the gas nozzle 201 to supply the oxidizing gas. In an implementation, the oxidizing gas may include, e.g., pure oxygen or a compound gas including oxygen.

Figure 5:
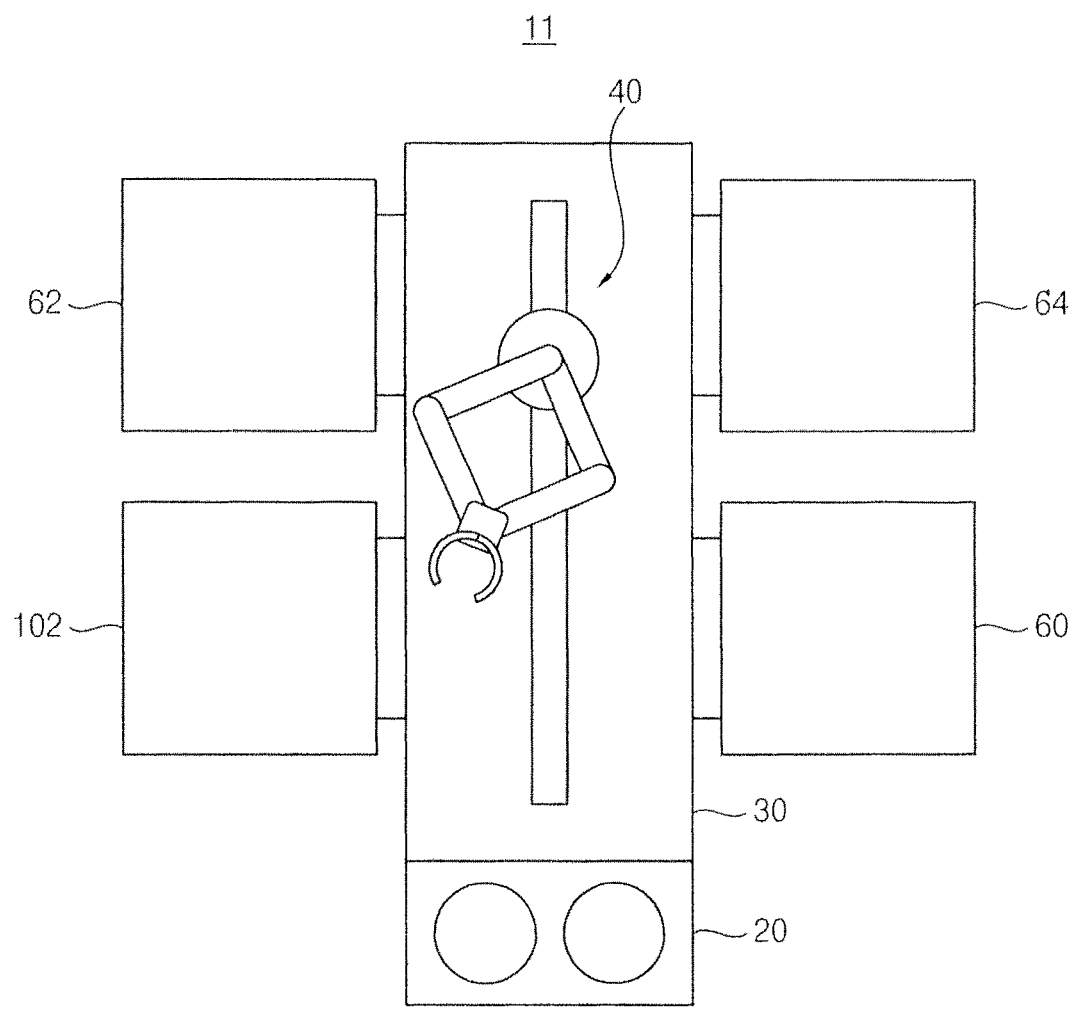
FIG. 5 illustrates a plan view of a substrate processing system in accordance with example embodiments.
Figure 6:
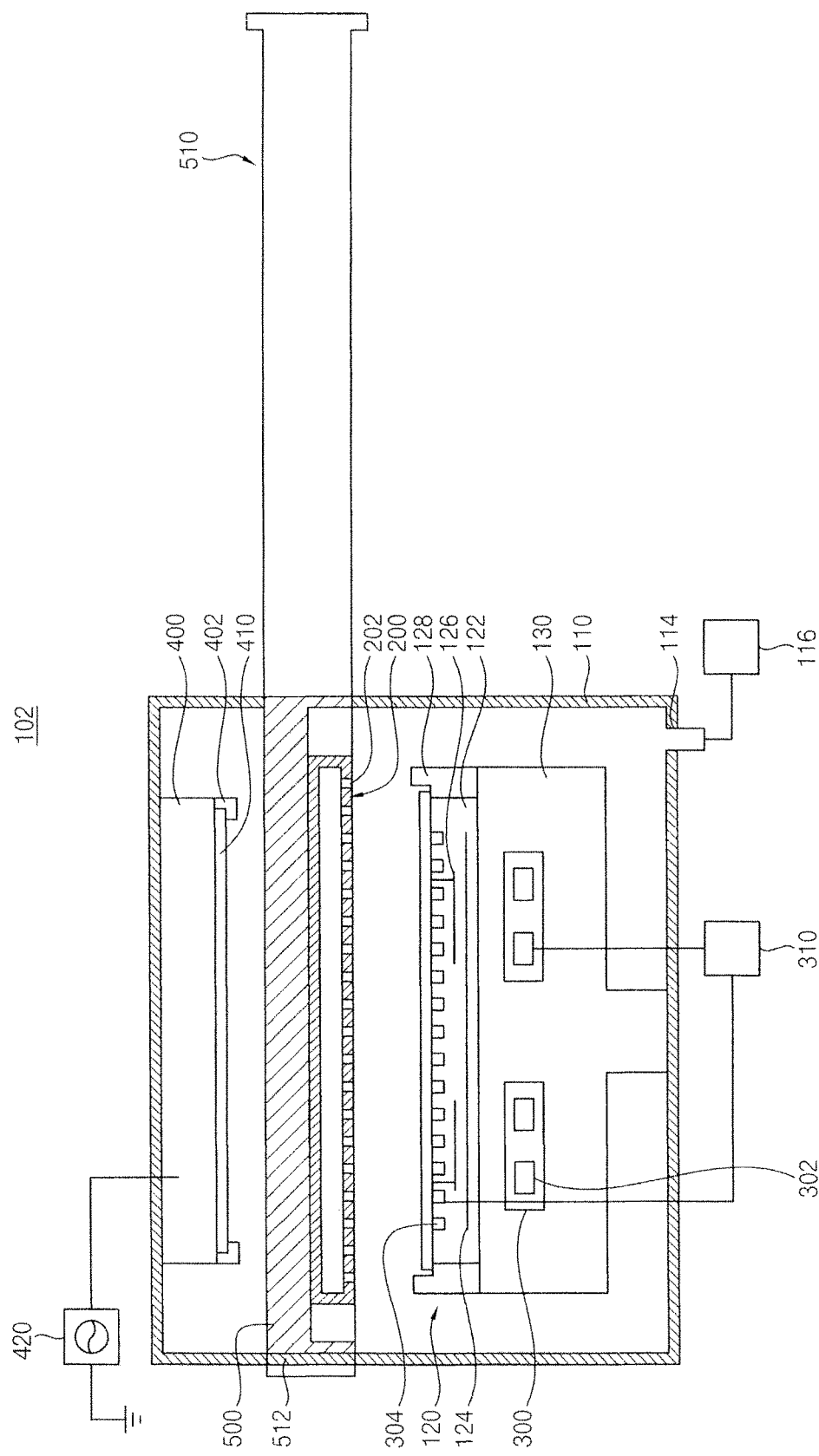
FIG. 6 illustrates a cross-sectional view of a substrate processing apparatus of a substrate processing system according to an exemplary embodiment.
Figure 7:
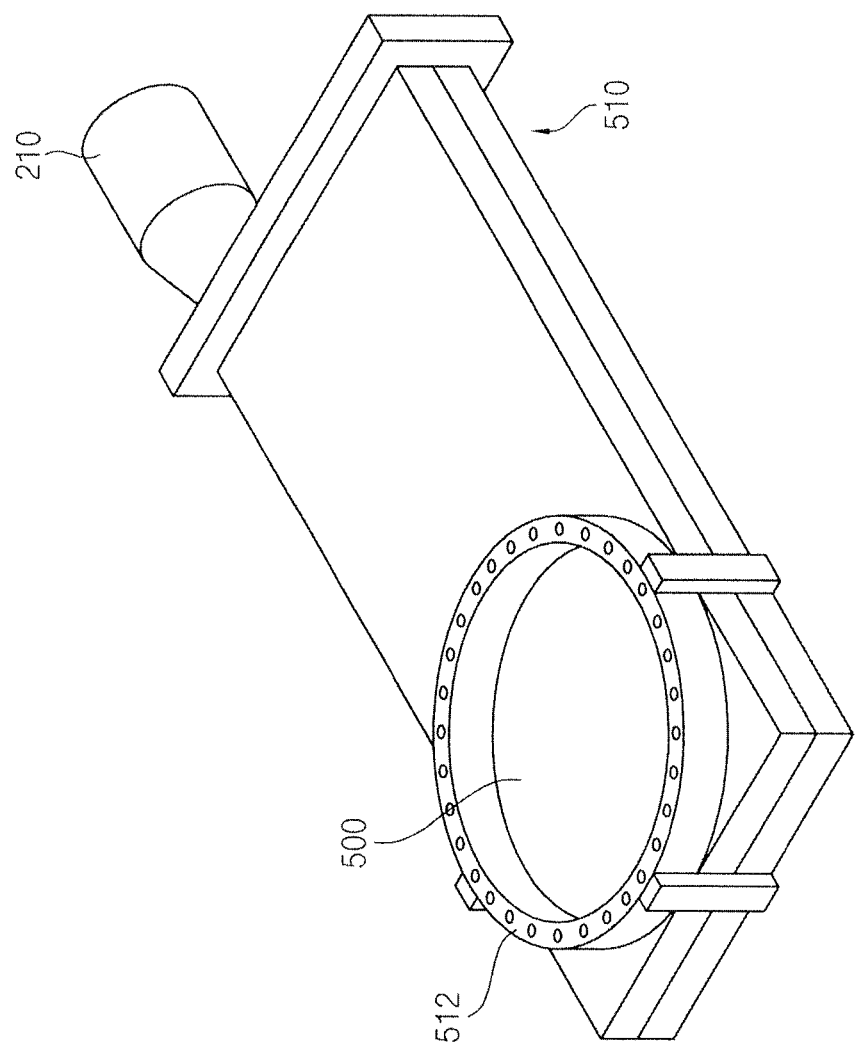
FIG. 7 illustrates a perspective view of a gate in a housing of a substrate processing apparatus according to an exemplary embodiment.
Figure 8:
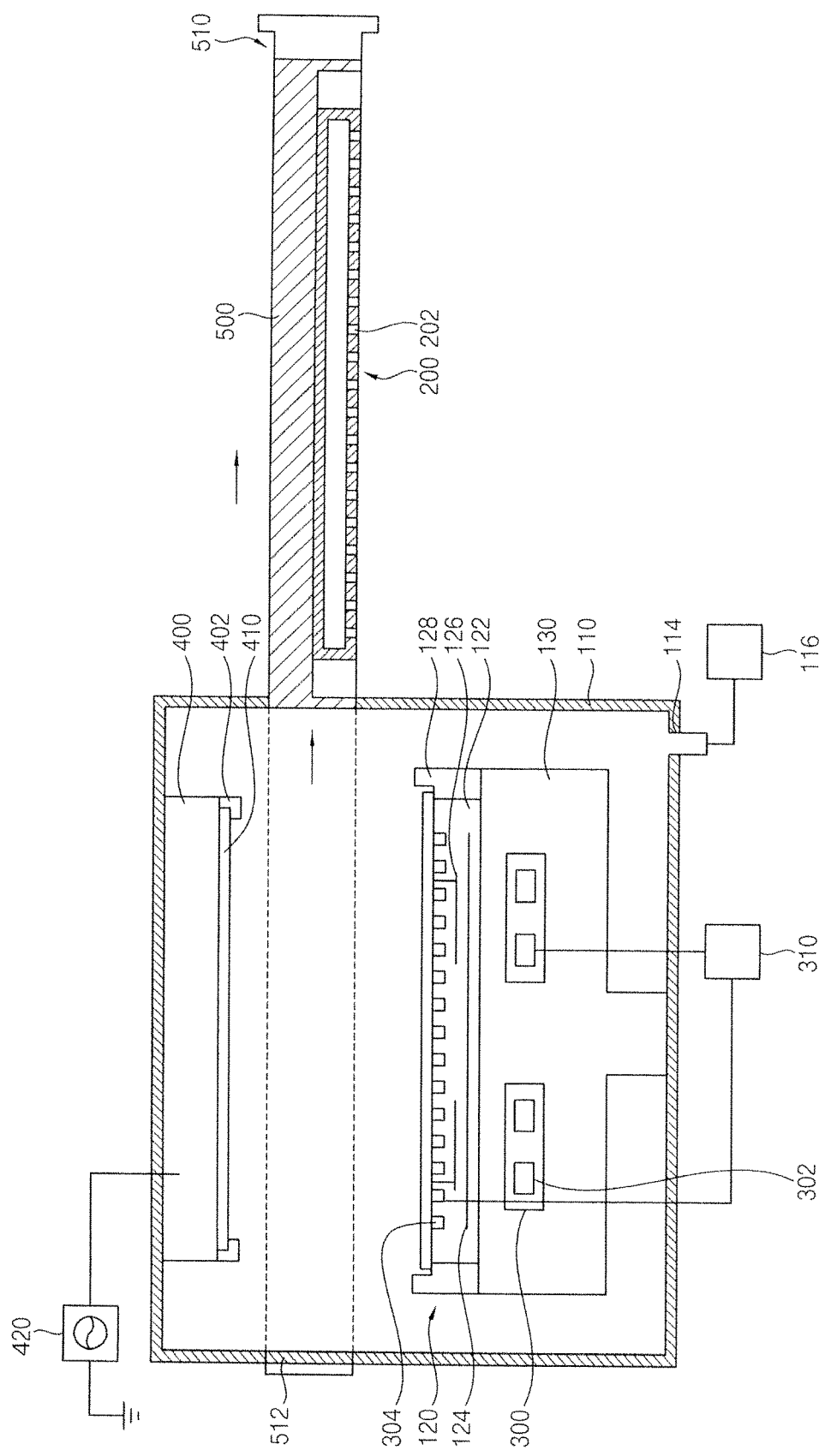
FIG. 8 illustrates a cross-sectional view of a showerhead moving together with a gate of a substrate processing apparatus according to an exemplary embodiment.

FIG. 5 illustrates a plan view of a substrate processing system according to some embodiments. FIG. 6 illustrates a cross-sectional view of a substrate processing apparatus of the substrate processing system of FIG. 5. FIG. 7 illustrates a perspective view of a gate in a housing of the substrate processing apparatus of FIG. 6. FIG. 8 illustrates a cross-sectional view of a showerhead moving together with the gate of the substrate processing apparatus of FIG. 6. The substrate processing apparatus may be substantially the same as or similar to the substrate processing apparatus described with reference to FIGS. 1 to 3, except that it may further include a target mount and a blocker.

Referring to FIGS. 5 to 8, the substrate processing system 11 may include a load lock chamber 20 for loading and unloading a substrate, such as a wafer, a transfer chamber 30 having a transfer robot 40 for transferring the substrate, and a plurality of process chambers 60, 62, 64 and 102. The transfer chamber 30 may be at a side of the load lock chamber 20. The plurality of process chambers 60, 62, 64 and 102 may be at sides of the transfer chamber 30.

In an implementation, the plurality of process chambers may include, e.g., a deposition/oxidation chamber 102, a first additional chamber 60, a second additional chamber 62, and a third additional chamber 64.

The deposition/oxidation chamber 102 may be a substrate processing apparatus for forming a metal layer on the wafer and for oxidizing the metal layer at a low temperature. Hereinafter, for convenience of explanation, the deposition/oxidation chamber 102 will be referred to as a substrate processing apparatus.

Referring to FIG. 6, the substrate processing apparatus 102 may include a substrate support 120, a cooler, a target mount 400, a gas injector, and a blocker. The substrate support 120 may be disposed in the chamber and include an electrostatic chuck 122 for supporting a substrate, such as a wafer W. The cooler may be disposed below the electrostatic chuck 122 and may cool the substrate. The target mount 400 may be disposed over the substrate. A target 410 for forming a metal layer on the substrate may be mounted on the target mount 400. The gas injector may include a showerhead 200 for uniformly injecting an oxidizing gas. The blocker may include a gate 500 that is configured to shield the target 410 from being exposed to the oxidizing gas injected from the gas injector.

In an implementation, the target mount 400 may be used for performing a physical vapor deposition (PVD) process. For example, the target mount 400 may be used to perform an RF sputtering process using an RF power source. The target mount 400 may include a target holder 402 for holding the target 410.

The target mount 400 may include an RF power supply 420 that supplies RF power to the target 410. The RF power supply 420 may supply a high frequency signal to the target 410. The RF power supply 420 may be disposed outside the chamber 110, and connected to the target 410. The high frequency power may be, e.g., from about 400 KHz to about 40 MHz.

The blocker may include the gate 500 that serves as a shutter for shielding a specific area. The gate 500 may be disposed between the target 410 and the showerhead 200 of the gas injector.

In an implementation, the gate 500 may traverse an interior space of the chamber 110 between the target mount 400 and the substrate support 120, and may extend along a plane parallel to the wafer W on the substrate support 120. For example, the interior of the chamber 110 may be divided into upper and lower chambers by the blocking unit including the gate 500 according to an embodiment.

A housing 510 may be internally located at a central portion of the chamber 110. The housing 510 may include a sidewall portion 512 that constitutes a portion of a sidewall of the chamber 110. The sidewall portion 512 of the housing 510 may include an opening through which the upper and lower chambers communicate with each other.

The gate 500 may include a plate that has a shape corresponding to a cross-sectional shape of the chamber 110. The blocker may include a driver that is configured to move the gate 500 in the housing 510. The gate may be installed to be movable along a plane parallel to the wafer W in the housing 510 to selectively open and close the opening of the sidewall portion 512. For example, the gate 500 may shield the target mount 400 from the lower chamber by moving into the chamber 110. For example, the gate 500 may be movable on the substrate support 120 to be brought in or out of position between the target 410 and the wafer W. During a sputtering process, the opening of the housing 510 may be opened by the gate 500. After performing the sputtering process, the opening of the housing 510 may be closed by the gate 500.

The showerhead 200 may be installed under the gate 500. For example, the showerhead 200 may be fixed to a lower surface of the gate 500 by fasteners. Thus, the showerhead 200 may be moved together with the gate 500.

The gate 500 may be capable of reciprocating between a first position in which the gate 500 is located between the target 410 and the substrate support 120, and a second position in which the gate 500 is located outside the chamber 110. In the first position, the chamber 110 may be separated into the upper and lower chambers by the gate 500, and in the second position, the upper and lower chambers may be communicated with each other.

Referring to FIG. 8, when the sputtering process using the target 410 is performed on the wafer W, the gate 500 may be moved from the first position to the second position. Referring to FIG. 6, when an oxidation process using the oxidizing gas is performed on the wafer W, the gate 500 may be moved to the first position between the target 410 and the wafer W.

In an implementation, the sputtering process and the oxidation process may be performed in-situ in one chamber. The oxidation process may be performed at a cryogenic temperature. For example, when a metal oxidation layer is formed on a free layer of a magnetic tunnel junction structure, a switching distribution may be improved by preventing oxygen penetration into the free layer. In an implementation, it is possible to reduce an area (or footprint) occupied by the chamber and to increase unit per equipment hour (UPEH).

Figure 9:
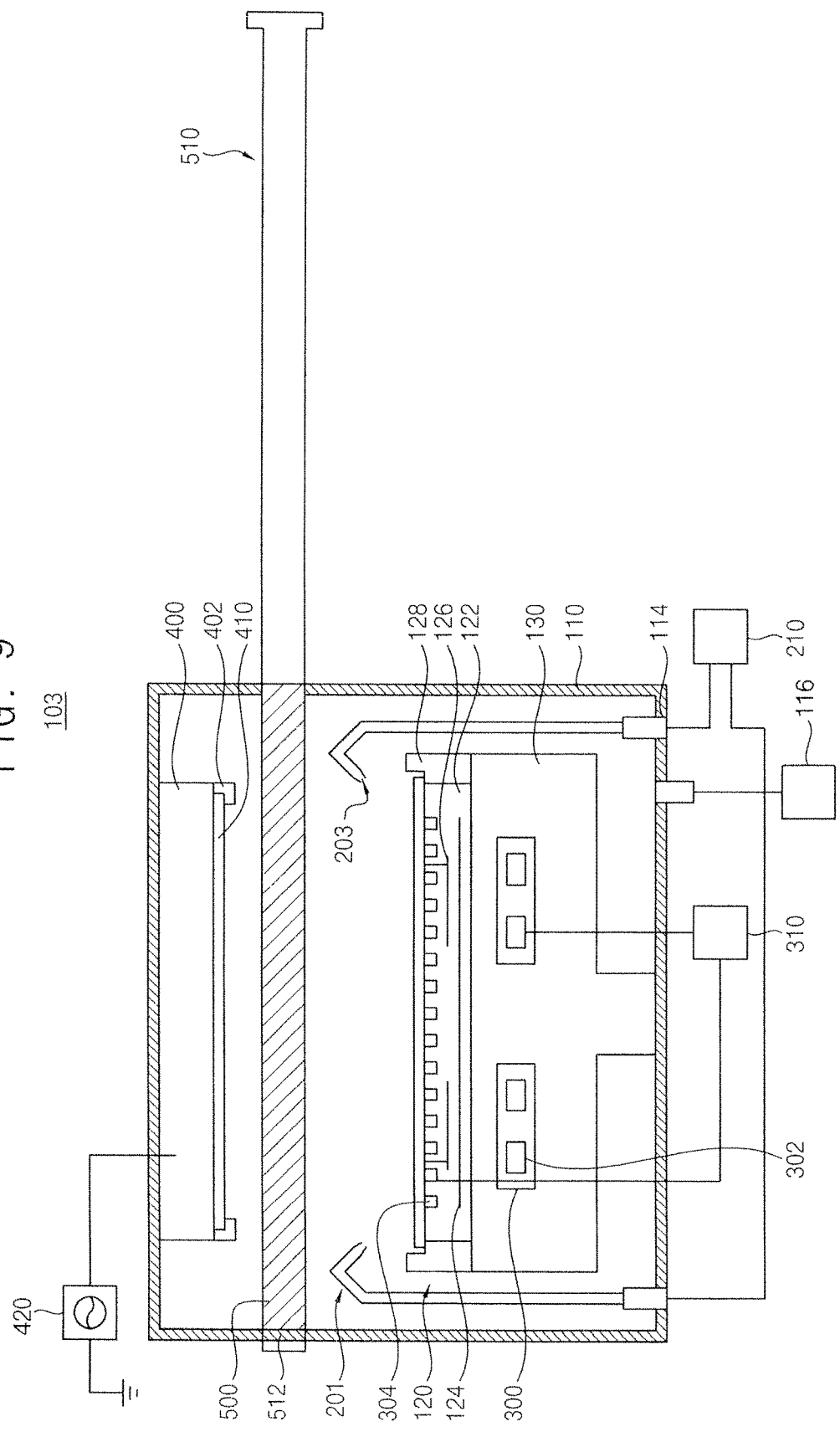
FIG. 9 illustrates a cross-sectional view of a substrate processing apparatus in accordance with example embodiments.

FIG. 9 illustrates a cross-sectional view of a substrate processing apparatus according to some embodiments. The substrate processing apparatus may be substantially the same as or similar to the substrate processing apparatus described with reference to FIGS. 5 to 8 except for a gas injector.

Referring to FIG. 9, a gas injector of the substrate processing apparatus 103 may include at least one gas nozzle 201 for injecting an oxidizing gas into a chamber 110.

In an implementation, the gas injector may include a plurality of gas nozzles 201 disposed around a substrate support 120. The gas nozzle 201 may include a gas introduction portion extending upwardly from a lower surface of the chamber 110, and a nozzle portion having an injection hole 203 from the gas introduction portion toward a wafer on the substrate support 120.

The nozzle portion of the gas nozzle 201 may be provided on the substrate support 120, and may spray the oxidizing gas for oxidizing a metal layer formed on the wafer W. A gas supply 210 may be connected to the gas nozzle 201 to supply the oxidizing gas. In an implementation, the oxidizing gas may include, e.g., pure oxygen or a compound gas that includes oxygen as a component thereof.

The gate 500 may be capable of reciprocating between a first position in which the gate 500 is located between the target 410 and the gas nozzle 201, and a second position in which the gate 500 is located outside the chamber 110. In the first position, the chamber 110 may be separated into upper and lower chambers by the gate 500, and in the second position, the upper and lower chambers may be communicated with each other.

When the sputtering process using the target 410 is performed on the wafer W, the gate may be in the second position. When the oxidation process is performed using an oxidizing gas, the gate 500 may be in the first position between the target 410 and the gas nozzle 201.

FIGS. 10 to 13 illustrate cross-sectional views of stages in a method of forming a memory unit of a magnetoresistance memory device according to example embodiments.

Figure 10:
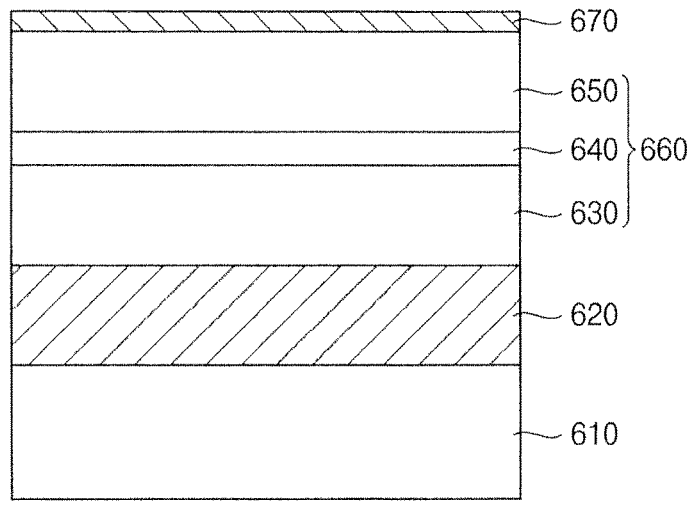
FIGS. 10 to 13 illustrate cross-sectional views of stages in a method of forming a memory unit of a MRAM device in accordance with example embodiments.

Referring to FIG. 10, a lower conductive layer 620, a magnetic tunnel junction structure 660, and a metal layer 670 may be sequentially formed on a substrate 610.

The lower conductive layer 620 may include a metal and/or a metal nitride. The lower conductive layer 620 may include, e.g., a metal, such as tungsten, titanium, or tantalum, and/or a metal nitride, such as tungsten nitride, titanium nitride, or tantalum nitride.

The magnetic tunnel junction structure 660 may include a fixed layer structure 630, a tunnel barrier layer 640, and a free layer 650, which are sequentially stacked on the substrate 610.

In an implementation, the fixed layer structure 630 may include a fixed layer, a lower ferromagnetic layer, an antiferromagnetic coupling spacer layer, and an upper ferromagnetic layer.

The fixed layer may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, or Cr. Each of the upper and lower ferromagnetic layers may include a ferromagnetic material including at least one of iron (Fe), nickel (Ni), and cobalt (Co). The antiferromagnetic coupling spacer layer may include, e.g., at least one of ruthenium (Ru), iridium (Ir), and rhodium (Rh).

The tunnel barrier layer 640 may include, e.g., at least one of aluminum oxide or magnesium oxide.

The free layer 650 may include, e.g., a ferromagnetic material including at least one of iron (Fe), nickel (Ni), and cobalt (Co).

In an implementation, the metal layer 670 may be formed on the free layer 650 using the deposition chamber of FIG. 1 or the substrate processing apparatus of FIG. 5.

For example, referring to FIG. 8, the substrate 610, on which the free layer 650 is formed, may be loaded on the electrostatic chuck 122 in the chamber 110. The gate 500 may be moved out of the first position (between the target 410 and the substrate) to the second position (outside the chamber 110). In an implementation, the metal layer 670 may be formed on the substrate by performing a sputtering process using the target 410.

The metal layer 670 may include a metal having a large spin-orbit coupling. In an implementation, the metal layer 670 may include, e.g., a heavy metal. In an implementation, the metal layer 670 may include, e.g., tungsten, tantalum, platinum, or bismuth.

Figure 11:
Figure 11:
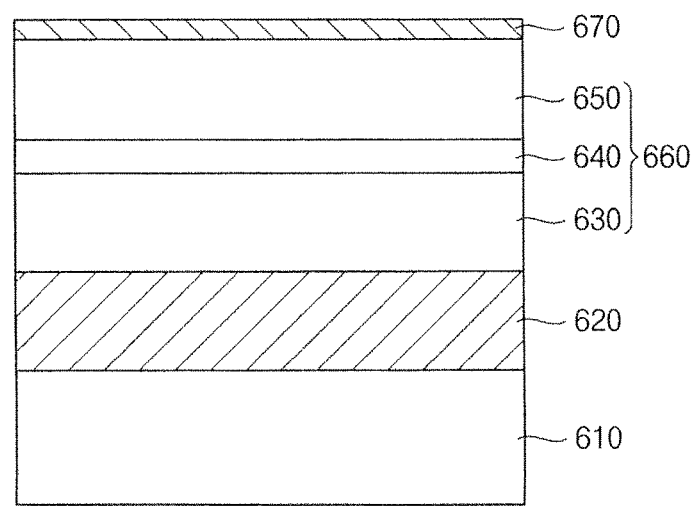

Referring to FIG. 11, the metal layer 670 may be oxidized using the substrate processing apparatus of FIG. 1 or the substrate processing apparatus of FIG. 5 to form a metal oxide layer 672. For example, the metal oxide layer 672 may include a heavy metal oxide having a large spin-orbit coupling.

For example, referring to FIG. 6, the gate 500 may be moved to the first position between the target 410 and the substrate, and then, after a temperature of the substrate is cooled to a target temperature using the cooler, an oxidizing gas may be injected through the showerhead 200 to uniformly oxidize the metal layer on the substrate. For example, a metal oxide layer may be formed on the substrate. The metal oxide layer may be formed at a cryogenic temperature, and oxygen may be prevented from penetrating into the free layer when forming the metal oxide layer. For example, defects due to oxygen migration into the free layer may be reduced.

Figure 12:
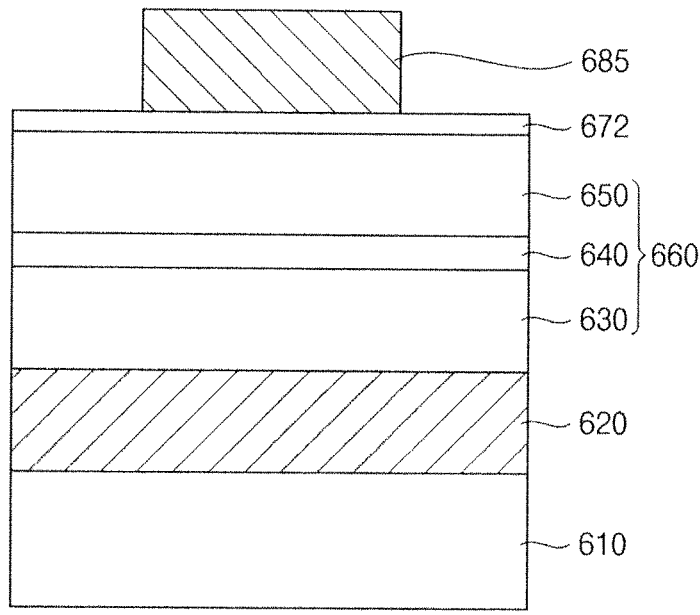

Referring to FIG. 12, an upper electrode 685 may be formed on the metal oxide layer 672.

The upper electrode 685 may be formed by patterning an upper electrode layer that is formed on the metal oxide layer 672.

The upper electrode layer may include a metal and/or a metal nitride. The upper electrode layer may include, e.g., a metal, such as tungsten, titanium and tantalum, and/or a metal nitride, such as tungsten nitride, titanium nitride and tantalum nitride.

Figure 13:
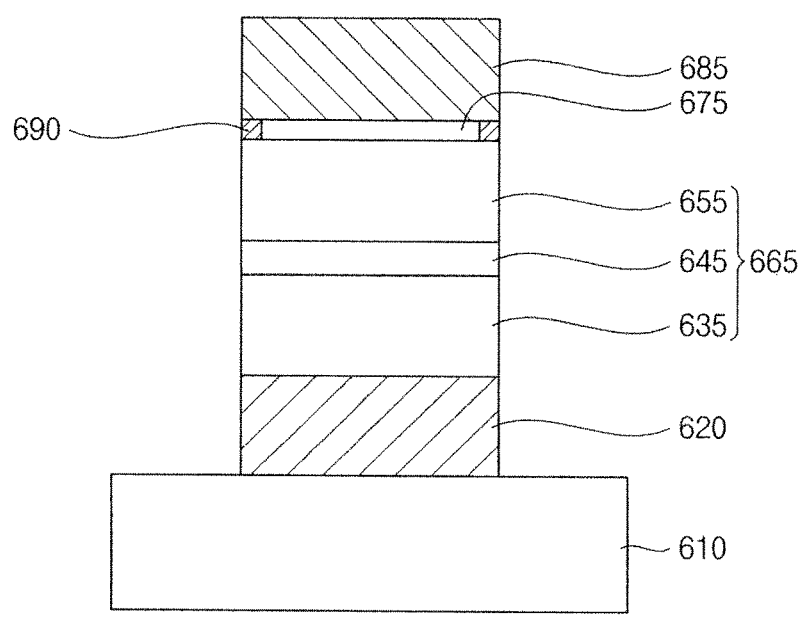

Referring to FIG. 13, the metal oxide layer 672, the magnetic tunnel junction (MTJ) structure layer 660 and the lower electrode layer 620 may be sequentially etched by performing a dry etching process using the upper electrode layer 685 as an etch mask. The dry etching process may include, e.g., an ion beam etching process or a sputtering process.

After performing the dry etching process, a lower electrode 625, a magnetic tunnel junction (MTJ) structure 665, a metal oxide pattern 675 and the upper electrode 685 may be sequentially stacked on the substrate, and a conductive pattern 690 may be formed on at least a portion of a sidewall of the metal oxide pattern 675. The lower electrode 625, the magnetic tunnel junction (MTJ) structure 665, the metal oxide pattern 675, the conductive pattern 690 and the upper electrode 685 may constitute a memory unit.

When the metal oxide layer 672 is etched by the etching process to form the metal oxide pattern 675, a metal component included in the metal oxide pattern 675 may be redeposited on the sidewall of the metal oxide pattern 675, or the metal component and ions and/or particles used in the etching process may be mixed with each other. In an implementation, the conductive pattern may be formed on the sidewall of the metal oxide pattern 675. A metal component of the upper electrode 685 may be also redeposited, or the ions and/or the particles may be also mixed with the metal component included the upper electrode 685.

Thus, the conductive pattern 690 may include the metal component included in the metal oxide pattern 675 and/or the metal component included in the upper electrode 685. The conductive pattern 690 may include, e.g., tungsten, tantalum, platinum, bismuth, or titanium.

The memory unit may be formed through the above-described processes according to an embodiment.

By way of summation and review, a switching current density (Jc) in the MRAM device may be reduced with a view toward improving characteristics of the MTJ structure. A metal oxide layer may be formed on the free layer to help reduce the switching current density (Jc). According to an embodiment, a movement of oxygen to the free layer when forming the metal oxide layer may be suppressed.

The embodiments may provide a substrate processing apparatus for forming a thin film on a wafer and a method for manufacturing a magnetoresistive random access memory (MRAM) device with a magnetic tunnel junction (MTJ) structure using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising:
a chamber accommodating a substrate;
a substrate support in the chamber, the substrate support supporting the substrate;
a cooler under the substrate to cool the substrate;
a gate disposed to be movable into and out of the chamber and operated to selectively divide the chamber into upper and lower chambers;
a gas injector to inject an oxidizing gas for oxidizing a metal layer on the substrate, the gas injector including a showerhead that is fixedly installed on a lower portion of the gate; and
a target mount facing the substrate and including a target for performing a sputtering process.

2. The substrate processing apparatus as claimed in claim 1, wherein, when the gate is in the chamber:
the gate is between the target and the gas injector, and
the gate shields the target from the oxidizing gas injected from the gas injector.

3. The substrate processing apparatus as claimed in claim 1, wherein the gate is movable such that the gate is not in a position between the target and the substrate when a sputtering process is performed using the target and is in the position between the target and the substrate when an oxidation process is performed using an oxidizing gas.

4. The substrate processing apparatus as claimed in claim 1, wherein the cooler is operated to maintain the substrate at a temperature of less than about 298K when the oxidizing gas is injected.

5. The substrate processing apparatus as claimed in claim 1, wherein:
the substrate support includes an electrostatic chuck for supporting the substrate, and
the electrostatic chuck is in direct contact with a cooling surface of the cooler.

6. A substrate processing apparatus, comprising:
a chamber in which a substrate is accommodatable;
a substrate support in the chamber and on which the substrate is supportable, the substrate support including a cooler therein;
a target mount facing the substrate support, the target mount including a target for performing a sputtering process that forms a metal layer on the substrate,
a gas injector to inject an oxidizing gas that oxidizes the metal layer on the substrate;
a gate between the target and the gas injector, the gate shielding the target from the oxidizing gas,
wherein the gas injector includes a showerhead facing the substrate and that uniformly distributes the oxidizing gas onto the substrate.

7. The substrate processing apparatus as claimed in claim 6, wherein the cooler cools the substrate when the oxidizing gas is injected by the gas injector.

8. The substrate processing apparatus as claimed in claim 6, wherein the gate:
is movably installable between the target and the substrate support, and
is capable of separating a space between the target and the substrate support.

9. The substrate processing apparatus as claimed in claim 8, wherein:
the showerhead is fixedly installed on a substrate-facing side of the gate.

* * * * *